United States Patent [19]

Bryant et al.

[11] Patent Number: 4,981,813
[45] Date of Patent: Jan. 1, 1991

[54] PAD OXIDE PROTECT SEALED INTERFACE ISOLATION PROCESS

[75] Inventors: Frank R. Bryant, Denton; Yu-Pin Han, Dallas; Fu-Tai Liou, Irving; Tsiu C. Chan, Carrollton, all of Tex.

[73] Assignee: SGS-Thomson Microelectronics, Inc., Carrollton, Tex.

[21] Appl. No.: 279,343

[22] Filed: Dec. 2, 1988

Related U.S. Application Data

[63] Continuation of Ser. No. 17,357, Feb. 24, 1987, abandoned.

[51] Int. Cl.⁵ .................. H01L 21/76; H01L 21/304
[52] U.S. Cl. ........................................ 437/73; 437/72; 437/69; 437/64; 156/644; 156/649; 156/653; 156/662
[58] Field of Search ............... 156/644, 648, 649, 653, 156/662; 437/63, 64, 69, 72, 73

[56] References Cited

U.S. PATENT DOCUMENTS

| | | | |
|---|---|---|---|
| 4,272,308 | 6/1981 | Vourshney | 437/73 |
| 4,495,025 | 1/1985 | Haskell | 156/648 |
| 4,526,631 | 7/1985 | Silvestri et al. | 156/644 |
| 4,534,824 | 8/1985 | Chen | 156/628 |
| 4,560,421 | 2/1985 | Maeda et al. | 148/1.5 |
| 4,579,621 | 4/1986 | Hine | 156/612 |
| 4,585,513 | 4/1986 | Gale et al. | 156/644 |
| 4,626,281 | 1/1987 | Buiguez et al. | 437/73 |
| 4,645,564 | 2/1987 | Morie et al. | 156/643 |
| 4,686,000 | 8/1987 | Heath | 156/644 |
| 4,690,729 | 9/1987 | Douglas | 156/643 |
| 4,758,530 | 7/1988 | Schubert | 437/73 |
| 4,868,136 | 9/1989 | Ravaglia | 437/73 |

FOREIGN PATENT DOCUMENTS

| | | | |
|---|---|---|---|
| 0284456 | 9/1988 | European Pat. Off. | 437/73 |
| 0063842 | 4/1982 | Japan | 437/73 |
| 3418638 | 11/1984 | Netherlands . | |

OTHER PUBLICATIONS

Swada et al. "Electrical Properties ... Swami Technology" IEEE Trans. on Elec. Dev. vol. ED-32 No. 11, 11/85, pp. 2243-2248.
Abstract 273, Inulshi et al. Extended Abs. vol. 86-2 Oct. 19-24, 1986.

Primary Examiner—David Simmons
Assistant Examiner—Lori Ann Johnson
Attorney, Agent, or Firm—Richard K. Robinson; Kenneth C. Hill

[57] ABSTRACT

Field oxide regions are formed between active regions of a silicon substrate by forming over the substrate a sandwich of silicon dioxide, silicon nitride and silicon dioxide layers, opening the layers to expose a portion of the silicon substrate, removing a layer of the exposed substrate, forming side wall spacers on the edges of the opening, removing a layer of the silicon substrate exposed between the side wall spacers, and then reaching the exposed substrate for the thermal oxidation of the exposed substrate for forming the field oxide region. In those structures in which the field oxide is buried in the substrate as shown in FIG. 12, it may be feasible to use thicker field oxide regions and thereby to reduce the need for the heavily doped surface layer under the field oxide.

2 Claims, 4 Drawing Sheets

4,981,813

PAD OXIDE PROTECT SEALED INTERFACE ISOLATION PROCESS

RELATED APPLICATION

This application is related to application Ser. No. 167,547, filed 03/14/88, having a common assignee. This is a continuation of Ser. No. 017,357 filed 02/24/87 and now abandoned.

BACKGROUND OF THE INVENTION

In the above-identified application, there is described a process for forming a localized field oxided region of relatively narrow width by a process which involves forming over a silicon substrate a succession of layers including in turn a pad thermally grown silicon oxide layer, a CVD (chemical vapor deposited) silicon nitride layer, and a CVD silicon oxide layer thereafter using photolithographic techniques for masking pattern definition as aperture with relatively vertical side walls is formed through the outer two layers, terminating at the thermally grown oxide. Next a conformed CVD silicon nitride layer is deposited in a manner to fill the aperture rising over the edges of the aperture to extend over the surface of the CVD silicon oxide layer. This layer is then etched an isotropically to remove the thickness corresponding to the conformed silicon nitride layer to reform the aperture but leaving silicon nitride side wall spacers which effectively reduce the lateral dimensions of the aperture. The resultant is then heated in an oxidizing atmosphere to thicken the thermally grown oxide exposed in the aperture to the thickness desired for the field oxide.

This technique permits achieving field oxide regions of narrower widths than the minimum size fixture realizable by standard photolithographic techniques by the width of the side wall spacers provided after the original field oxide pattern has been defined by the photolithographic process.

The present invention relates to improvements in the basic process described.

SUMMARY OF THE INVENTION

First, it has been found desirable in the basic process described to form the original aperture also through the thermally grown pad silicon oxide formed on the substrate. By this expedient, in the final structure the pad oxide under the field oxide region is eliminated and there is a consequent reduction of field oxide penetration into the active area by elimination of this oxygen diffusion path.

Moreover, as a further possible improvement, after elimination of the pad oxide in the original aperture, there is also removed a portion of the silicon substrate. Thereafter, when the workpiece is finally oxidized to form the field oxide, there results a field oxide region which is of reduced height and also has a characteristic bird's beak of reduced length.

Moreover, as a still further improvement of this last-described technique, after the reformation of the aperture narrowed by the spacer side walls, the exposed silicon substrate is further etched to form a symmetric staircase pattern in the silicon substrate. Thermal oxidation of the resulting structure leaves a field oxide of still further reduced height and a bird's beak of reduced length.

The invention will be better understood from the following more detailed description taken with the accompanying drawing in which:

DETAILED DESCRIPTION

Figure 1:
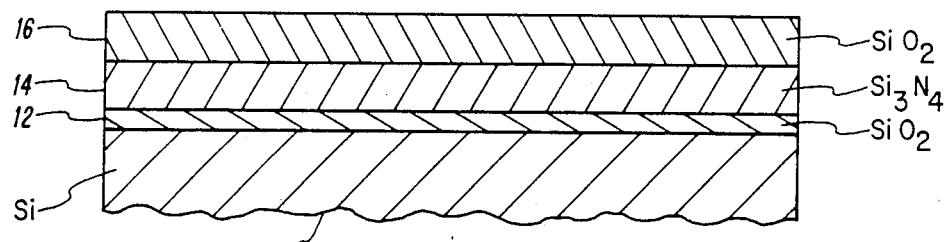
FIGS. 1-5 show the silicon workpiece at various stages of its processing in accordance with one embodiment of the invention.

In FIG. 1, there is shown a portion of a silicon monocrystalline wafer, designed to be diced into a plurality of silicon chips each embodying an integrated circuit, after suitable processing. To this end, each chip is to include a plurality of active regions in which are to be formed one or more active circuit elements and which are to be separated from one another by relatively thick field oxide regions, as is well known in the art.

The drawing will focus on the formation of only one of such thick field oxide regions to simplify the disclosure.

As shown in FIG. 1, the silicon wafer has formed on one of its major surfaces a succession of layers including a thermally grown silicon dioxide layer 12, a silicon nitride layer 14, and a silicon dioxide layer 16. The silicon dioxide layer 12 is often described as a pad layer and it primarily serves as a stress release layer and etch stop layer of nitride etch between the silicon substrate and the silicon nitride layer that minimizes defects in the silicon substrate.

Various techniques are available for forming such an arrangement. Advantageously, the silicon nitride layer 14 is formed by a low pressure chemical vapor deposition process and the silicon dioxide layer 14 is formed by a chemical vapor deposition process. Typical dimensions found suitable are about 200 Angstroms for layer 12, 800 Angstroms for layer 14, and 1000 Angstroms for layer 16. There then is formed an aperture or opening in the multiple layers, slightly larger than that desired for the localized field oxide region desired. Typically, the aperture would be about 1.2 microns wide and considerably longer lengthwise, the direction normal to the plane of the drawing. To improve the packing density of active elements in a chip, the width of the field oxide region should be as narrow as the technology makes practice.

Various techniques are available for providing the desired aperture, generally involving photolithographic patterning of a suitable photoresist mask and subsequent etching of the pattern exposed by the mask. Since the aperture desirably should have essentially vertical side walls to save space, ion milling or anisotropic reactive ion etching (RIE) generally will be performed at the present stage of the technology.

Figure 2:
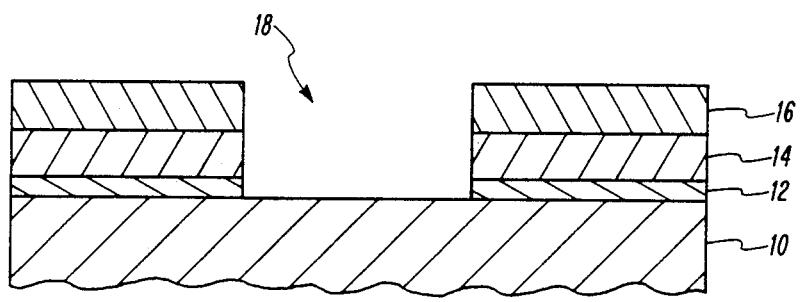

In FIG. 2, there is shown the workpiece 10 with an opening 18 which penetrates to the silicon substrate.

Figure 3:
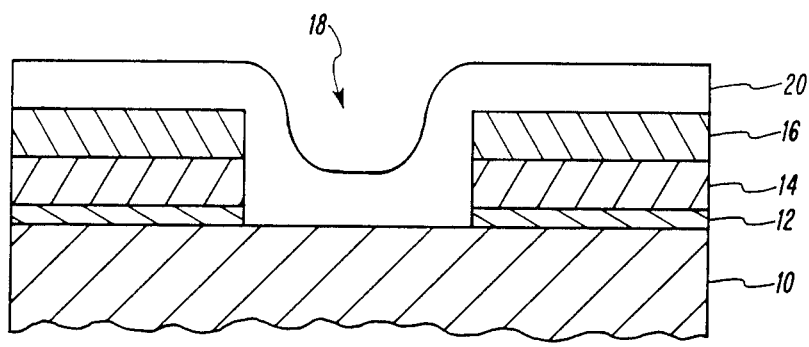

Next there is deposited over the workpiece a conformed coating of silicon nitride 20, typically also deposited by LP CVD and the resultant is shown in FIG. 3. The thickness of the layer 20 will determine how much the aperture 18 will be narrowed so it is chosen appropriately. A thickness of between 2000 and 2500

Angstroms typical for the particular embodiment being described.

Figure 4:
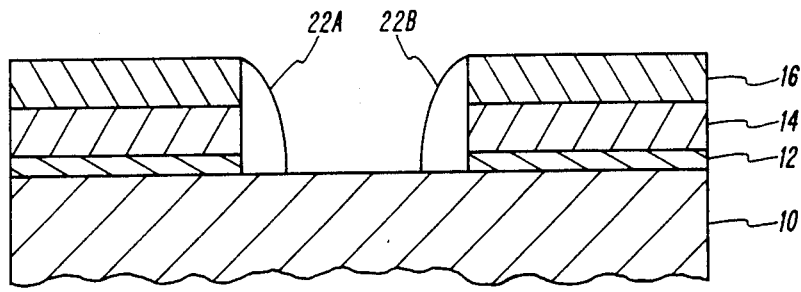

This is then followed by an isotropic etching only until the silicon nitride layer 20 has been removed from the bottom of the central portion of the original aperture so, that the etching leaves the side wall spacers 22A and 22B along the original edges of the aperture, as shown in FIG. 4. As is seen in FIG. 4, these spacers result in a narrowing of the width of the exposed silicons in the apertures.

Thereafter the workpiece is heated in the manner usual for forming the field oxide, which typically involves heating the workpiece in an oxidizing atmosphere for a suitable time for achieving the desired thickness, typically at least several thousands Angstroms.

Figure 5:
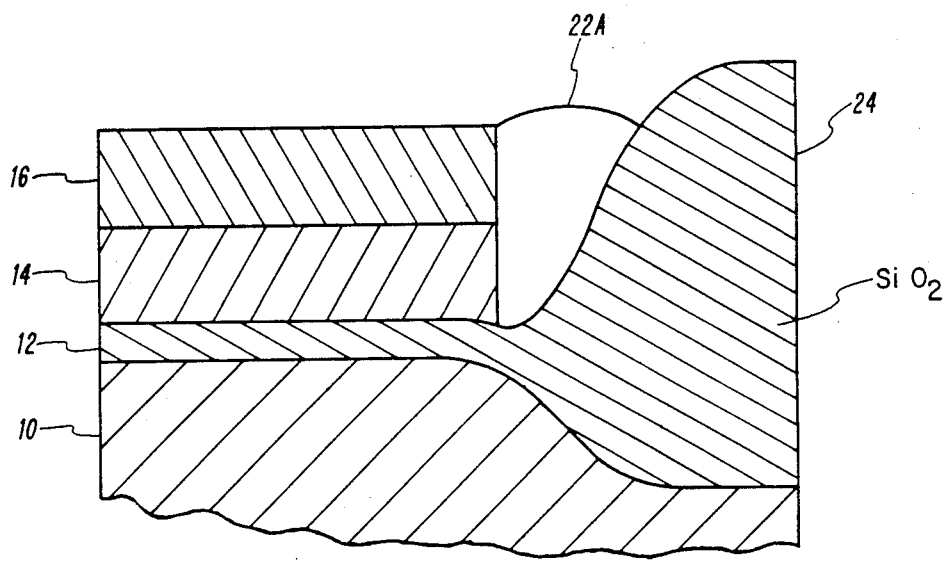

In FIG. 5, on an expanded scale, there is shown one edge of the resultant field oxide region 24. As seen in this figure, the upper surface of the field oxide will rise significantly above the surface of the original silicon surface. This may pose a disadvantage particularly when the interconnect wiring for the integrated circuit comprises one or more levels of metallization over the silicon chip which are desirably as planar.

FIGS. 6-10 show a modification of the basic process described which permits a field oxide thickness of the same thickness but with a reduction in the amount the top surface of the field oxide rises above the surface of the silicon substrate along the active regions between the field oxide region.

Figure 6:
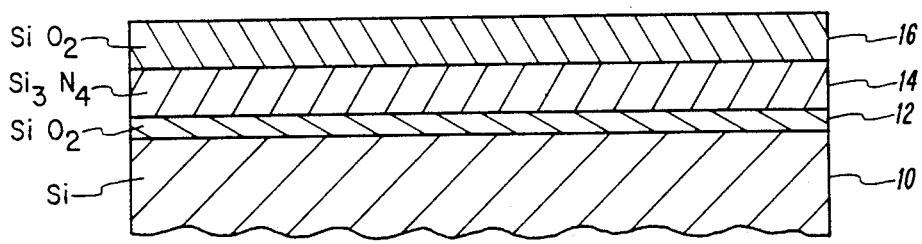
FIGS. 6-10 show the silicon workpiece at various stages of its processing in accordance with another embodiment of the invention.
Figure 7:
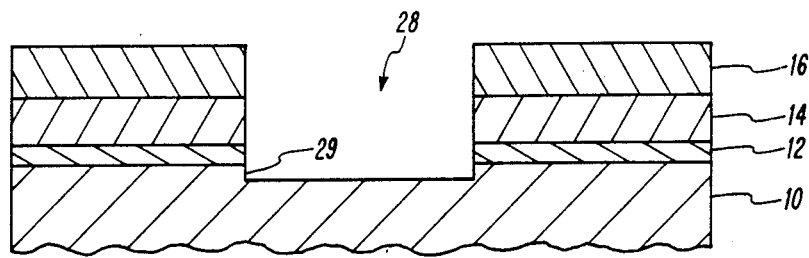

In these figures, FIG. 6 corresponds to FIG. 1, but as shown in FIG. 7, the depth of the aperture 28 shown in FIG. 7 penetrates below the original level of the silicon substrate. To this end, after baring the silicon surface by removing layers 12, 14 and 16, the etching is continued either by a separate step or by a continuation of the same process when ion milling is used to form the aperture, to remove a layer of the desired thickness of the silicon substrate, shown as 29 in FIG. 7. A thickness of about a thousand Angstroms is suitable.

Figure 8:
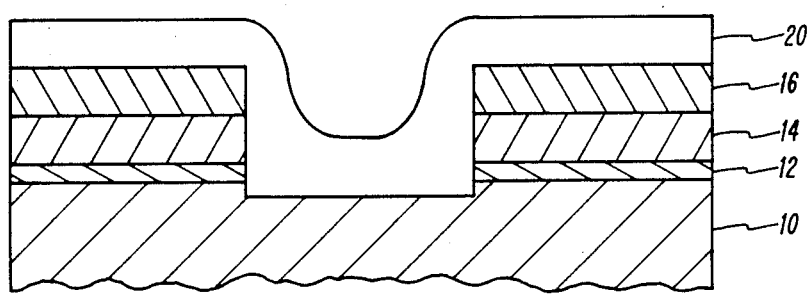
Figure 9:
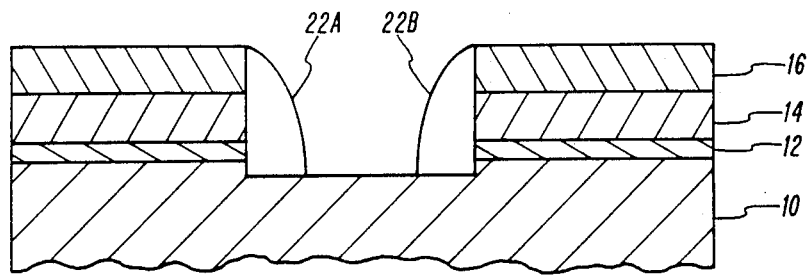
Figure 10:
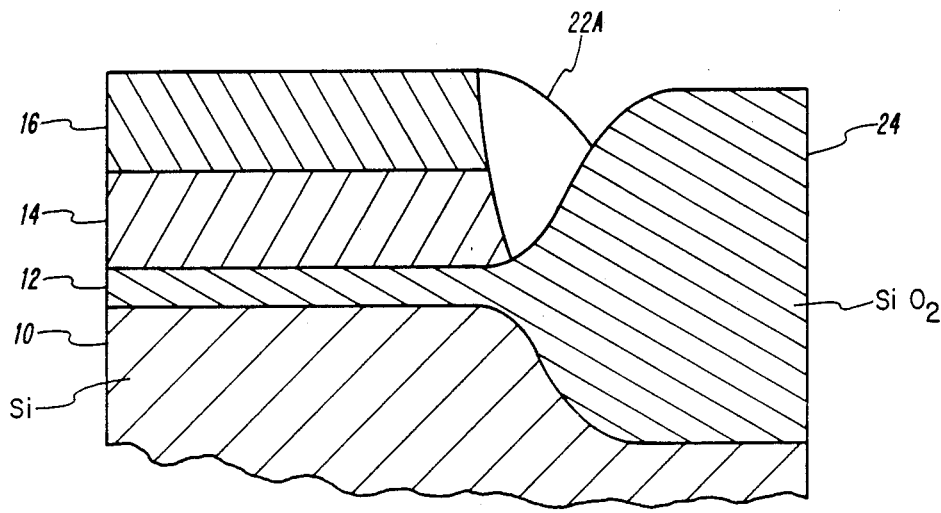

Further processing proceeds as before, involving deposition of a conformed silicon nitride layer 20 as shown in FIG. 8, patterning the layer 20 to expose the silicon substrate but leaving side wall spacers 22A, 22B as seen in FIG. 9, and then heating in an oxidizing atmosphere for the requisite time to form the field oxide 24 as shown in FIG. 10.

Figure 11:
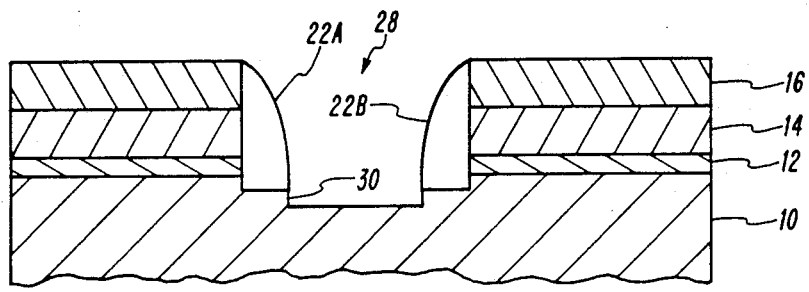
FIGS. 11 and 12 show the silicon workpiece at the final two stages of a variation of the process illustrated in FIGS. 6-10.

A further reduction in the effective height of the field oxide can be achieved by the modifications illustrated in FIG. 11. To this end, after formation of the side wall spacers, as illustrated in FIG. 9, an additional layer of the exposed silicon substrate is removed, as designated by numeral 30 in FIG. 11. Again a layer of a thickness of about a thousand Angstroms should be suitable. This layer can be removed as the earlier layer 29 was removed, for example, either by ion milling or reactive ion etching.

Figure 12:
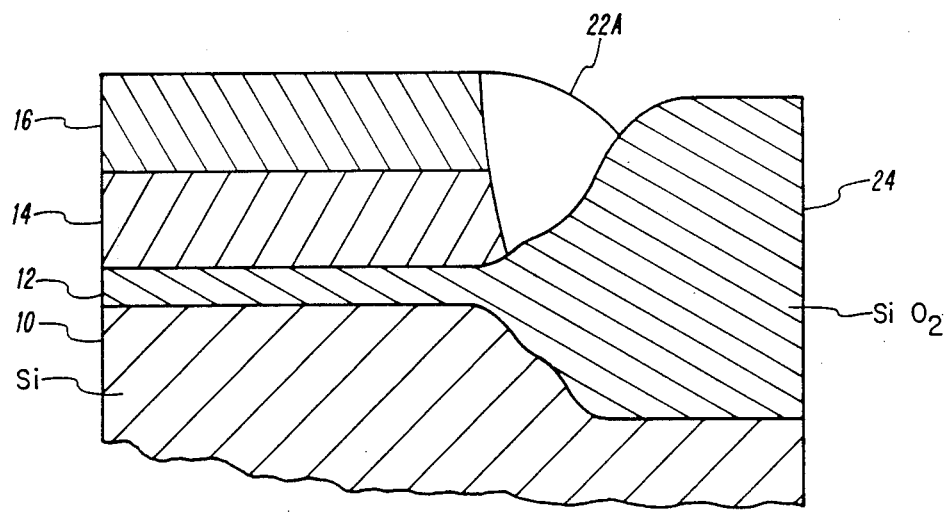

The resultant is shown in FIG. 12 where the upper surface of the field oxide region 24 is shown as extending relatively less above the surface of the silicon surface along the active regions between field oxide regions.

It can be appreciated that the particular dimensions described are merely illustrative. Additionally, it should be apparent that other materials could be used for the various layers 12, 14-16 and 20 so long as they function appropriately. In particular, it is feasible to omit layer 16 in the process described at some sacrifice in the profile of the side spacers left after etching of the conformed layer.

Accordingly, the specific embodiments which have been described should be viewed merely as illustrative of the general principles involved and various other embodiments may be devised by a worker in the art without departing from the spirit and scope of the invention. For example, there may be omitted the step of etching the surface layer 29 as shown in FIG. 7 although there is later removed the surface layer 30 as depicted in FIG. 11.

Additionally, as known to workers in the art, it is usual to include in the substrate below the field oxide a heavily doped surface layer to reduce the possibility of surface inversion. The processes described can be modified to include before the thermal oxidation step one or more ion implantation steps in the usual fashion to form such heavily doped layers if desired. Moreover, when the field oxide is used to overlie the junction between P-wells and N-wells in a substrate to be used for CMOS devices, it may be desirable to include a heavily doped N-type surface layer in the N-well and a heavily doped P-type surface layer in the P-well.

What is claimed:

1. A process for forming oxide regions between active regions of a silicon substrate used in the manufacture of integrated circuits comprising the steps of:
   forming a first layer of silicon oxide on a first surface of the silicon substrate;
   providing a first layer of silicon nitride over the first layer of silicon oxide;
   forming a second layer of silicon oxide over the first layer silicon nitride;
   forming apertures through the second layer of silicon oxide, the first layer of silicon nitride, the first layer of silicon oxide, and extending to a first bottom portion below the first surface of the silicon substrate by a predetermined amount, said apertures having substantially vertical sidewalls;
   forming spacer portions of silicon nitride on the aperture sidewalls leaving the first bottom portion of the silicon substrate exposed;
   etching a second bottom portion into the first bottom portion, said second bottom portion having substantially vertical sidewalls; and
   oxidizing the second bottom portion of the silicon substrate.

2. The process of claim 1 wherein the step of forming sidewall spacer portions of silicon nitride comprises the steps of depositing a second layer of silicon nitride over the second layer of silicon oxide and partially filling the apertures; and
   etching the second layer of silicon nitride for exposing the second layer of silicon oxide and the second bottom portion of the silicon substrate while leaving sidewall spacer portions of the silicon nitride on the sidewall of the apertures.

* * * * *